(12) United States Patent
Ehrmann et al.

(10) Patent No.: US 9,730,326 B2
(45) Date of Patent: Aug. 8, 2017

(54) ELECTRICAL CONTACT ARRANGEMENT FOR AN ELECTRIC MOTOR AND METHOD FOR PRODUCING THE SAME

(71) Applicant: BROSE FAHRZEUGTEILE GMBH & CO. KOMMANDITGESELLSCHAFT, Würzburg (DE)

(72) Inventors: Steffen Ehrmann, Aub (DE); Katharina Gerlach, Wuerzburg (DE); Artur Schmidt, Wuerzburg (DE); Karl-Heinz Fleischmann, Marienwerder (DE)

(73) Assignee: BROSE FAHRZEUGTEILE GMBH & CO. KG, WÜRZBURG, Würzburg (DE)

( * ) Notice: Subject to any disclaimer, the term of this patent is extended or adjusted under 35 U.S.C. 154(b) by 0 days.

(21) Appl. No.: 14/911,595

(22) PCT Filed: Aug. 14, 2014

(86) PCT No.: PCT/EP2014/067451
§ 371 (c)(1),
(2) Date: Feb. 11, 2016

(87) PCT Pub. No.: WO2015/024867
PCT Pub. Date: Feb. 26, 2015

(65) Prior Publication Data
US 2016/0192494 A1    Jun. 30, 2016

(30) Foreign Application Priority Data

Aug. 20, 2013 (DE) .................. 10 2013 216 472

(51) Int. Cl.
*H01R 4/24* (2006.01)
*H05K 1/18* (2006.01)
(Continued)

(52) U.S. Cl.
CPC ............ *H05K 1/181* (2013.01); *B23K 31/02* (2013.01); *H01R 12/53* (2013.01); *H01R 4/242* (2013.01);
(Continued)

(58) Field of Classification Search
CPC .. H01R 4/2433; H01R 4/2429; H01R 4/2454; H01R 4/2425; H01R 9/0757; H01R 13/6315; H01R 9/2458; H01R 2107/00
(Continued)

(56) References Cited

U.S. PATENT DOCUMENTS 3,501,582 A * 3/1970 Heidler ................ H05K 3/3405
174/524
4,083,615 A * 4/1978 Volinskie ............. H01R 12/774
439/402
(Continued)

FOREIGN PATENT DOCUMENTS

DE   198 22 346 A1   11/1999
DE   199 46 130 A1    3/2000
(Continued)

OTHER PUBLICATIONS

International Search Report and Written Opinion for International Patent Application No. PCT/EP2014/067451, dated Dec. 3, 2014, 8 pages.
(Continued)

*Primary Examiner* — Abdullah Riyami
*Assistant Examiner* — Vladimir Imas
(74) *Attorney, Agent, or Firm* — Westman, Champlin & Koehler, P.A.

(57) ABSTRACT

Electrical contact arrangement for an electric motor and method for producing same. The present invention relates to an electrical contact arrangement for an electric motor, in particular for an EC drive of a motor vehicle fan, comprising
(Continued)

an elongate contact which runs perpendicular to a planar basic conductor, wherein the basic conductor is in the form of a leadframe, and a conductive cohesive and/or form-fitting and/or force-fitting connection is provided between the leadframe and the contact. The present invention also relates to a method for the production of said electrical contact arrangement.

10 Claims, 2 Drawing Sheets

(51) Int. Cl.
*H01R 12/53* (2011.01)
*B23K 31/02* (2006.01)
*H01R 9/22* (2006.01)
*H01R 101/00* (2006.01)

(52) U.S. Cl.
CPC .......... *H01R 9/226* (2013.01); *H01R 2101/00* (2013.01); *H01R 2201/26* (2013.01); *H05K 2201/10295* (2013.01)

(58) Field of Classification Search
USPC .................................................. 439/402, 395
See application file for complete search history.

(56) References Cited

U.S. PATENT DOCUMENTS

| | | | | |
|---|---|---|---|---|
| 4,084,877 A * | 4/1978 | Knickerbocker | .... | H01R 4/2429 439/402 |
| 4,413,871 A * | 11/1983 | Swengel, Jr. | ........ | H01R 4/2462 439/402 |
| 4,449,165 A * | 5/1984 | Kaufman | ................ | H05K 7/20 361/723 |
| 4,600,971 A * | 7/1986 | Rose | ....................... | H05K 3/202 206/717 |
| 4,630,879 A * | 12/1986 | van Alst | .............. | H01R 4/2433 439/402 |
| 4,811,168 A * | 3/1989 | Chesnut | ............... | H05K 7/1417 361/736 |
| 4,875,877 A * | 10/1989 | Fleak | ................... | H01R 13/648 439/108 |
| 4,944,684 A * | 7/1990 | Leibowitz | .............. | H01R 31/02 361/792 |
| 5,030,138 A * | 7/1991 | Capp | ..................... | H01R 13/514 439/497 |
| 5,085,595 A * | 2/1992 | Koegel | ................. | H01R 12/592 439/494 |
| 5,412,166 A * | 5/1995 | Krupp | .................... | H01H 1/403 200/6 B |
| 5,782,651 A * | 7/1998 | Konoya | ............... | H01R 4/2429 439/405 |
| 5,791,943 A * | 8/1998 | Lo | ....................... | H01R 13/6397 439/491 |
| 5,938,479 A * | 8/1999 | Paulson | ............... | H01R 4/2433 439/676 |
| 6,017,239 A * | 1/2000 | Watanabe | ............. | H01R 9/226 439/402 |
| 6,116,964 A * | 9/2000 | Goodrich | ............ | H01R 3/6467 439/676 |
| 6,172,590 B1 * | 1/2001 | Shrier | .................... | H01L 23/62 338/20 |
| 6,220,874 B1 * | 4/2001 | Kurata | ................. | B60R 16/0207 439/76.2 |
| 6,280,231 B1 * | 8/2001 | Nicholls | .............. | H01R 4/2429 439/402 |
| 6,312,288 B1 * | 11/2001 | Genz | ................... | H01H 11/0031 439/149 |
| 6,353,190 B1 * | 3/2002 | Sumida | ................ | H01R 9/2458 174/261 |
| 6,447,325 B1 * | 9/2002 | Yamane | ................ | H01R 9/226 439/404 |
| 6,851,967 B2 * | 2/2005 | Miyoshi | ............... | H01R 4/4836 439/441 |
| 7,118,404 B2 * | 10/2006 | Ploesser | ............... | H01R 4/2454 439/395 |
| 7,134,903 B1 * | 11/2006 | Pavlovic | .............. | H01R 4/2454 439/404 |
| 7,210,957 B2 * | 5/2007 | Mrakovich | ............. | F21S 4/001 439/404 |
| 7,572,149 B2 * | 8/2009 | Matsuura | .............. | H01R 12/616 439/620.21 |
| 7,637,767 B2 * | 12/2009 | Davis | ................... | H01R 13/514 439/352 |
| 7,806,703 B2 * | 10/2010 | Wallrafen | ............ | H01R 13/112 439/81 |
| 7,811,129 B2 * | 10/2010 | Glover | ............... | H01R 13/6599 439/607.07 |
| 7,946,878 B2 | 5/2011 | Lang et al. | | |
| 8,118,605 B2 * | 2/2012 | Yoshida | ............... | B60Q 3/0203 439/76.2 |
| 8,383,940 B2 * | 2/2013 | Yoshida | ............... | B60Q 3/0203 174/68.2 |
| 8,403,682 B2 * | 3/2013 | Motoda | .................. | H01R 12/73 439/74 |
| 8,523,586 B2 * | 9/2013 | Eusterholz | ........ | H01L 31/02013 439/259 |
| 8,550,832 B2 * | 10/2013 | Regnier | ............... | H01R 4/2429 439/260 |
| 8,717,007 B2 * | 5/2014 | Banhegyesi | ......... | G01R 22/065 324/110 |
| 9,236,665 B2 | 1/2016 | Gotzen | | |
| 9,444,159 B2 * | 9/2016 | Lappoehn | ............ | H01R 4/2433 |

FOREIGN PATENT DOCUMENTS

| | | |
|---|---|---|
| DE | 198 51 532 A1 | 6/2000 |
| DE | 10 2004 024 790 A1 | 12/2005 |
| DE | 10 2006 052 119 A1 | 5/2008 |
| DE | 10 2010 016 865 A1 | 11/2011 |
| DE | 10 2010 029 494 A1 | 12/2011 |
| DE | 10 2011 082 140 A1 | 3/2013 |
| DE | 10 2011 121 943 A1 | 6/2013 |
| JP | H09-74005 A | 3/1997 |
| JP | 2005-135698 A | 5/2005 |
| KR | 10-2008-0006709 A | 1/2008 |
| WO | 2009/112097 A1 | 9/2009 |

OTHER PUBLICATIONS

German Search Report for German Patent Application No. 10 2013 216 472.6, dated Jul. 4, 2014, 5 pages.
First Office Action dated Mar. 10, 2017 for corresponding Chinese Application No. 201480046189.6.
Office Action for Korean Patent Application No. 10-2016-7007233, dated Apr. 17, 2017, 13 pages.

* cited by examiner

ELECTRICAL CONTACT ARRANGEMENT FOR AN ELECTRIC MOTOR AND METHOD FOR PRODUCING THE SAME

CROSS-REFERENCE TO RELATED APPLICATION

This Application is a Section 371 National Stage Application of International Application No. PCT/EP2014/067451, filed 14 Aug. 2014 and published as WO 2015/024867 A1 on 26 Feb. 2015, in English, the contents of which are hereby incorporated by reference in their entirety.

FIELD

Embodiments of the present invention relate to an electrical contact arrangement for an electric motor and a method for the production thereof.

TECHNICAL BACKGROUND

Electrical contact arrangements for electric motors exist in a wide range of variants and embodiments. In this case, the type of contact arrangements required depends inter alia on the construction of the electric motor.

In the case of brushless direct current machines, known as EC (electronically commutated) motors or also referred to as BLDG (brushless DC) or BL motors, what are known as phase contacts are required. Said contacts usually extend perpendicularly from a base conductor (a circuit board or a lead frame) on which the power electronics necessary for activating the motor are often provided. In a contact arrangement known to the applicant, the phase contacts are perpendicularly soldered to a circuit board as an SMD (surface-mounted device) component. In another contact arrangement known to the applicant, the phase contacts are formed in one piece from a lead frame and are angled perpendicularly thereto.

A further contact arrangement is described in the international patent application WO 2009/112097 A1. According thereto, a pin extends through a conductor and rests on the surface of the conductor by means of a shoulder.

All of these contact arrangements can in each case be provided individually for specific power classes.

SUMMARY

Against this background, an object of embodiments of the present invention is that of specifying an improved contact arrangement.

According to some embodiments of the invention, this object is achieved by a contact arrangement described herein.

According thereto, the following is provided.

An electrical contact arrangement for an electric motor, in particular for an EC drive of a motor vehicle fan, comprising an elongate contact which extends perpendicularly to a planar base conductor, characterised in that the base conductor is formed as a lead frame and in that a conductive integral and/or positive and/or non-positive connection is provided between the lead frame and the contact.

A method for producing an electrical contact arrangement, in particular a contact arrangement according to the invention, comprising the steps of: providing a flat lead frame and an elongate contact; arranging the contact perpendicularly to the lead frame; producing a conductive integral and/or positive and/or non-positive connection between the contact and the lead frame.

The concept on which the present invention is based consists in attaching a (phase) contact to a lead frame by means of an integral and/or positive and/or non-positive 90° connection. In this way, it is possible to use a universal lead frame in phase contacts and to interconnect said contacts in the modular system. Individual parts can advantageously be produced thereby in large quantities and more economically on account of economies of scale.

Moreover, a consistent manufacturing process for different power classes, in particular for all power classes of motor vehicle fan drives, is provided thereby, as a result of which synergies can be better used when producing the different power classes.

Advantageous embodiments and developments are found in the further dependent claims and in the description, with reference to the drawings.

In one embodiment, the conductive connection comprises at least one plug extension on the contact and at least one recess on the lead frame, which recess corresponds to the plug extension, the plug extension being fastened in the recess by means of a press fit. A press fitting process is preferably used for fastening, the recess preferably being present in the form of a hole and the plug extension preferably having a rectangular cross-sectional area. As a result, the corners of the cross-sectional area of the plug extension are slightly deformed during the press fitting process, as a result of which a non-positive connection occurs between the plug extension and the recess of the lead frame. Alternatively, however, it is also conceivable to provide a classic cylindrical press fit.

In a further embodiment, the conductive connection comprises a fork formed in a planar manner in the lead frame, in which fork the contact is introduced and fastened. The contact is preferably staked in the fork. During staking, a permanent positive, non-positive and in addition in part integral connection is produced. In the process, the fork is fused on and shaped using pressing force and heat. As an alternative to staking, a soldered joint or a classic welded joint, for example by means of laser beam welding or resistance welding, would also be conceivable.

In an advantageous embodiment, the fork is formed in one piece with the lead frame and comprises a strut, by means of which said fork is connected to the lead frame. Thus, advantageously, no further fastening means are required for attaching the contact to the lead frame.

In a preferred embodiment, the strut is double-angled in a Z-shape. Optionally or in addition, the fork is arranged in parallel with the lead frame. The Z-shaped angling of the strut achieves an offset between the plane of the lead frame and the plane of the fork, as a result of which the accessibility of the fork for the fastening process, in particular the staking process, is improved. In the Z-shape, the bends can also be right-angled. The parallelism of the fork relative to the lead frame is preferred in this embodiment, since a perpendicular orientation of the contact to the lead frame is automatically achieved thereby. As an alternative to a spacing by means of a strut angled in a Z-shape, it would also be conceivable to provide an enlarged recess in the lead frame around the region of the fork, such that the fork can be reached by means of a tool in order to connect the fork to the contact.

In a further embodiment, the conductive connection has a contact foot angled perpendicularly away from the contact. Said foot extends in parallel with the lead frame and is welded on the surface thereof. A connection surface is thus advantageously provided on the contact, in which a preferred orientation of the contact is already provided perpendicularly to the lead frame. In order to weld the contact foot onto the lead frame, a projection welding method is preferably used, in which a bulge-like extension is provided on the contact foot and the contact foot is welded on by means of resistance welding. The bulge-like extension provides a punctiform resting point, which results in only a very small resting surface of the bulge on the lead frame. The resistance of the transition is thus increased, with the result that the material of the contact foot, which preferably contains copper, can be more easily melted on in order to produce a welded joint. After welding, a very large contact surface between the contact and the lead frame is then advantageously available, which surface is in particular larger than the mathematical sectional surface area between the geometries of the contact and the lead frame. As an alternative to projection welding, it would also be conceivable to connect the contact foot to the lead frame by means of a different resistance welding method, a laser beam welding method, an MIG (metal inert gas) welding method, a soldering method or the like. Moreover, a connection by means of a fastener would also be conceivable, for example by means of a rivet driven through the contact foot and the lead frame.

In one embodiment, the contact foot is guided through the lead frame and makes contact with the lead frame at the side of said foot which is oriented towards the contact. The side oriented towards the contact corresponds to the side which is oriented towards the extension direction of the contact. Advantageously, in particular tensile loads in the extension direction of the contact can thus be particularly well absorbed. Moreover, the connection point is thus shielded from the electric motor. This can be advantageous in particular in the case of an over-moulded lead frame, in which the surface provided for making contact is left free of the overmould. The overmould is formed as a plastics layer and is designed and provided for the purpose of corrosion protection and for insulation of the lead frame. The non-insulated contact point is then advantageously provided on the protected rear side of the lead frame.

In a further embodiment, the contact foot is brought into contact vertically on the lead frame at the side of said foot which is oriented away from the contact. In this case, the "sole" of the contact foot, i.e. the side of the contact foot which is oriented away from the extension direction of the contact, stands on the lead frame. Advantageously, the contact foot can thus be freely positioned on the lead frame, the perpendicular angle always being maintained. Moreover, no opening is required in the lead frame.

In a further embodiment, the conductive connection comprises a tab formed in the lead frame and having a back which is positioned perpendicularly to the lead frame and two tab wings which are angled perpendicularly to the back. In this case, the contact is introduced into the tab between the tab wings and fastened therein, in particular staked. The tab advantageously provides a fastening guide which is oriented perpendicularly to the plane of the lead frame and which particularly advantageously provides a very large contact surface between the contact and the lead frame, which surface is in particular greater than the mathematical sectional surface area between the geometries of the contact and the lead frame. In this case, the tab wings and the back surround the contact in a U-shape. However, the staking also preferably closes the open side of the U-shape, with the result that the contact is surrounded, in particular completely surrounded. Of course, the above-mentioned alternative connection processes, which can be used as alternatives to staking, are also possible in this case.

In a preferred embodiment, the tab is formed in one piece with the lead frame and comprises a strut which is connected to the back and by means of which said tab is connected to the lead frame. Particularly preferably, the tab can also be formed, in the unfolded surface thereof, during the lead frame production process. Subsequently, said tab is made into the final shape thereof by means of a shaping process. Advantageously in this case, the tab is already connected to the lead frame by means of the strut, with the result that no additional connection techniques are required. The production process for forming the tab is described in further detail below.

In one embodiment of the method for producing an electrical contact arrangement, the connection between at least one plug extension formed on the contact and at least one recess provided in the lead frame is produced by means of a press fit. The press fitting method which has already been described above is preferably used in this case. A connection is thus produced without application of heat being required therefor. Moreover, no additional auxiliary materials (solder, flux, Sil-fos or the like) are required. Moreover, in this case the contour of the contact attached to the tool is advantageously provided directly, without any additional bending process.

In a further embodiment of the method, the connection is produced using a fork, which is formed flat in the lead frame and comprises a strut by means of which said fork is connected to the lead frame, by means of the following steps: doubled, in particular Z-shaped, angling of the strut such that the fork is arranged so as to be spaced apart from and in parallel with the lead frame; introducing the contact into the fork; staking the fork and the contact. A particular advantage of this embodiment is that an annular contact can thus be attached and/or connected to the lead frame by means of very simple welding. Advantageously, in this case the contour of the contact attached to the tool can be provided without any additional bending process. In this case, the fork is preferably formed such that the contact can be inserted in the fork with a clearance fit prior to staking, so that the insertion is advantageously simple to carry out. During staking of the fork and the contact, a positive, non-positive and in addition in part also integral connection is preferably provided. For this purpose, a hot crimping tool is placed on the fork for example, by means of which tool heat and a pressing force can be simultaneously transferred to the fork. In the process, the material of the fork fuses and/or melts on in part and is simultaneously shaped in order to fasten the contact.

In a further embodiment of the method, the connection is produced using a contact foot, which is formed on the contact and is perpendicularly angled thereto and extends in parallel with the lead frame, by means of the following steps: guiding the contact foot through an opening in the lead frame and placing the surface of the contact foot oriented towards the contact on the lead frame, or positioning the surface of the contact foot oriented away from the contact on the lead frame; welding, in particularly projection welding, the contact foot onto the lead frame. The contact can in particular be an annular contact element which has been shaped flat and has been angled in the region of the contact foot. The annular contact element is thus connected to the lead frame by means of a very large contact surface, as a result of which the connection obtains high mechanical stability and high electrical conductivity. Alternatively thereto, it would also be conceivable for the contact to have a rectangular cross-sectional area and for the contact foot to constitute merely an angled portion of the contact. In the first alternative of the method (guiding through), it is advantageous that the connection can absorb high tensile forces in the extension direction of the contact. In the second alternative of the method (positioning) it is particularly advantageous that the contact can be welded to the lead frame by means of a large contact surface without an opening in the lead frame.

In a further embodiment of the method, the connection is produced using a tab, which is formed in one piece in the lead frame and comprises a back, in particular also a strut connected to the back, by means of which strut the tab is connected to the lead frame, and two tab wings which are angled perpendicularly to the back, by means of the following steps: positioning the back perpendicularly relative to the lead frame; angling the tab wings perpendicularly relative to the back; introducing the contact into the tab between the tab wings; staking the tab and the contact. When perpendicularly angling the tab wings relative to the back, a gap is preferably provided between the tab wings which are angled in the same direction, in which gap the contact can be inserted with a clearance fit. When staking the tab to the contact, a positive, non-positive and also at least in part integral connection is then produced between the tab and the contact. This connection technique also achieves a contact surface between the lead frame and the contact which is very large compared with the cross-sectional area of the contact, while also having a simple contact geometry, which provides an improved connection in terms of the mechanical strength and the electrical conductivity.

The above embodiments and developments can be combined as desired, as far as this is reasonable. Further possible embodiments, developments and implementations of the invention also comprise combinations, not explicitly stated, of features of the invention described above or in the following, with reference to the embodiments. In particular, in this case, a person skilled in the art would also add individual aspects as improvements or supplements to the respective basic configurations of the present invention.

DESCRIPTION OF THE DRAWINGS

The present invention will be described in greater detail in the following, on the basis of the embodiments shown in the schematic figures, in which.

Figure 1:
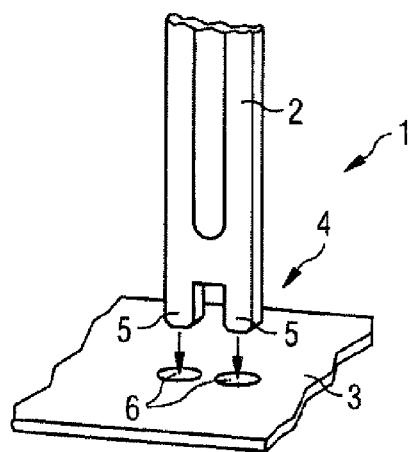
FIG. 1 is a perspective front view of an electrical contact arrangement in the press fitted design.

The accompanying drawings are intended to provide better understanding of the embodiments of the invention. The drawings show embodiments and, together with the description, explain principles and concepts of the invention. Other embodiments and many of the mentioned advantages can be found in the drawings. The elements of the drawings are not necessarily shown to scale relative to one another.

In the drawings, elements, features and components which are identical, function in the same manner and have the same effect are, if not specified otherwise, provided with the same reference numerals in each case.

DESCRIPTION OF EMBODIMENTS

FIG. 1 is a perspective front view of an electrical contact arrangement 1 in the press fitted design. The electrical contact arrangement 1 comprises a lead frame 3 and a contact 2. The lead frame 3 is an insert-moulded lead frame, the base material being a conductive metal, in particular copper, preferably E-Cu, and this conductive layer being over-moulded with a plastics casing (not shown). The contact is also a conductive material, in particular copper, preferably E-Cu. In the embodiment shown, a conductive connection 4 comprises two plug extensions 5 on the contact 2, which extensions each have a square cross-sectional area. In addition, two recesses 6, designed so as to correspond to the plug extensions 5, are provided in the lead frame 3. In the embodiment shown, said recesses are holes or annular holes. Any plastics casing is omitted in the region of the connection 4.

In order to fasten the contact 2 to the lead frame 3, the plug extensions 5 are pressed into the recesses 6. A non-positive connection is thus produced between the lead frame 3 and the contact 2, the material of the contact 2 and/or of the lead frame 3 being deformed in the region of the corners of the plug extensions 5 and thus a normal force being exerted on the contact surface, as a result of which a friction fit is produced. The connection thus consists in a non-positive fit at the contact surfaces, between the contact 2 and the lead frame 3.

Figure 2:
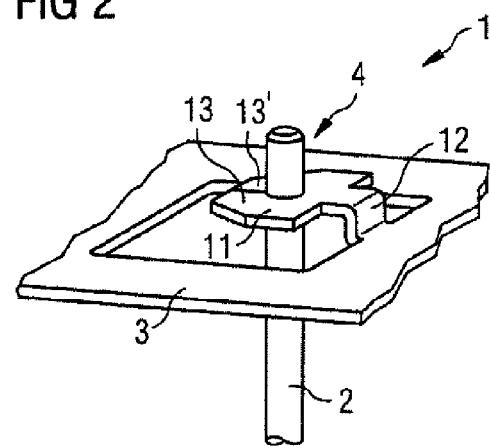
FIG. 2 is a perspective front view of an electrical contact arrangement comprising a fork formed in the lead frame.

FIG. 2 is a perspective front view of an electrical contact arrangement 1 comprising a fork 11 formed in the lead frame 3. For this purpose, the lead frame 3 is already formed in the same plane as the fork 11 integrated therein during punching out. The fork 11 comprises two fork extensions 13, 13' and a strut 12. In the unprocessed state (not shown) of the lead frame 3, the fork 11 extends in the plane of the lead frame 3, the strut 12 extending flat and the fork extensions 13, 13' likewise extending flat and so as to be spaced apart from one another in the plane of the lead frame 3. Subsequently, the strut 12 of the fork 11 is bent twice, into a Z-shape, in the manner shown in FIG. 2, such that the fork 11 extends in a plane which is in parallel with the plane of the lead frame 3. This serves to improve accessibility of the fork 11 by a staking tool. The Z-bends are preferably right-angled bends.

By means of a fork 11 of this kind, a contact 2, in particular an annular contact, which extends perpendicularly to the plane of the lead frame 3, can be fastened to the lead frame 3 at a 90° angle. For this purpose, the contact 2 is introduced between the two fork extensions 13, 13'. Subsequently, the fork 11, in particular the fork extensions 13, 13', is/are heated and crimped by means of a staking tool, such that a positive, non-positive and also at least in part integral connection is then produced between the contact 2 and the fork 11. The state shown in FIG. 2 is thus achieved, in which state the contact 2 is fastened in the fork 11 by means of staking and thus a conductive connection 4 is produced between the contact 2 and the lead frame 3.

Figure 3:
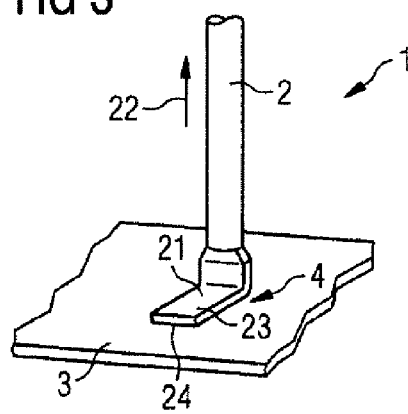
FIG. 3 is a perspective front view of a first variant of an electrical contact arrangement comprising a contact foot formed on the contact.

FIG. 3 is a perspective front view of a first variant of an electrical contact arrangement 1 comprising a contact foot 21 formed on the contact 2. The contact 2 is designed as an annular contact and is arranged at a 90° angle to the lead frame 3. The contact foot 21 is formed on a flattened end of the annular contact 2 and is angled perpendicularly to the extension direction 22 of the contact 2. The contact foot 21 comprises a side 23 which faces the contact and/or the extension direction 22 of the contact 2, and a side 24 which is remote from the contact and/or the extension direction thereof. In the embodiment shown, the contact 2 is positioned having the remote side 24, which forms the sole of the contact foot 21, as it were, on the lead frame 3. The electrically conductive connection 4 between the contact foot 21 and the lead frame 3 is produced by welding the contact foot 21 onto the lead frame 3. Particularly preferably, a projection welding method is used for this purpose. Alternatively thereto, a different resistance welding method, a laser beam welding method, or a soldering method can also be used to integrally connect the contact foot 21 to the lead frame 3. Preferably, in the process, the remote side 24 is welded to the lead frame over a large surface area, such that a large contact surface is produced which has high mechanical strength and high electrical conductivity.

Figure 4:
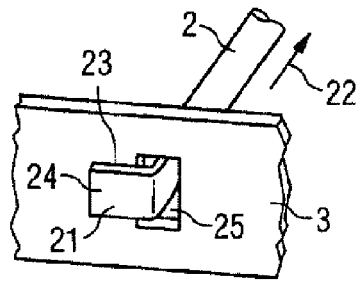
FIG. 4 is a perspective view from below of a second variant of an electrical contact arrangement comprising a contact foot formed on the contact.

FIG. 4 is a perspective view from below of a second variant of an electrical contact arrangement 1 comprising a contact foot 21 formed on the contact 2. In this case, the contact 2 extends perpendicularly to the plane of the lead frame 3 and comprises a contact foot 21 formed in a similar manner to the contact foot 21 shown in FIG. 3. Differently from the arrangement shown in FIG. 3, in the embodiment shown the contact foot 21 is guided through the lead frame 3 via a recess 25 in the lead frame 3 and fastened to the rear side of the lead frame 3. For this purpose, the side 23 of the contact foot 21 which faces the contact 2 and/or the extension direction 22 of the contact 2 rests on the lead frame 3 and is welded thereto over a large surface area. Similarly to the embodiment described with reference to FIG. 3, here too a wide range of joining techniques can be used, a projection welding process preferably being used. The recess 25 through which the contact foot 21 is guided is preferably already made when punching the lead frame 3, meaning that no additional manufacturing step is required therefor.

Figure 5A:
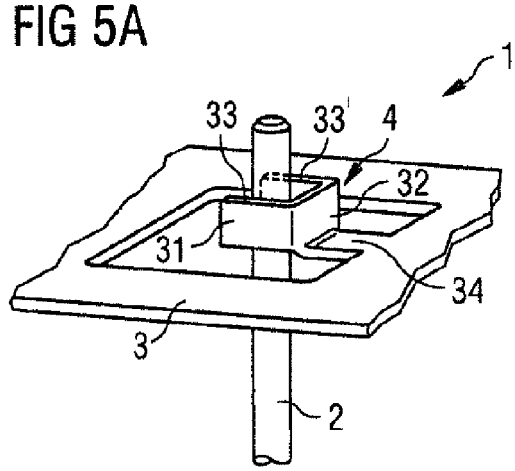
FIG. 5a is a perspective front view of an electrical contact arrangement comprising a tab formed in the lead frame.

FIG. 5a is a perspective front view of an electrical contact arrangement comprising a tab 31 formed in the frame. In this embodiment, the contact 2, which is designed as an annular contact, is likewise oriented perpendicularly to the lead frame 3. The tab 31 is formed in one piece with the lead frame 3 and is produced integrally during the process of producing the lead frame 3. For this purpose, an unfolded surface of the tab 31 is also punched out when punching the lead frame 3 and is subsequently bent into a tab 31 by means of shaping. The tab 31 comprises two tab wings 33, 33', a back 32 and a strut 34. The strut 34 is connected to the back 32 and to the remainder of the lead frame 3. The back 32 is angled perpendicularly to the strut 34 and extends in parallel with the contact 2. The tab wings 33, 33' are angled in the same direction, again perpendicularly to the back, and likewise extend in parallel with the contact 2. In order to produce an electrically conductive connection 4 between the lead frame 3 and the contact 2, the contact 2 is introduced into the tab 31 between the tab wings 33, 33'. For this purpose, the tab wings 33, 33' are preferably provided at a spacing from one another which is greater than the diameter of the contact 2, such that the contact 2 can be introduced easily into the tab 31 with a clearance fit. Subsequently, the tab wings 33, 33' and/or the tab 31 are staked to the contact 2, the tab wings 33, 33' in particular being shaped. A non-positive and positive, and in part integral, connection is thus produced between the contact 2 and the tab 31.

Due to the fact that, in the fully assembled state, the tab mostly, or preferably even completely, surrounds the contact 2, a particularly large contact surface between the contact 2 and the lead frame 3 is provided, as a result of which the mechanical stability of the connection 4 and the electrical conductivity are advantageously relatively high.

Figure 5B:
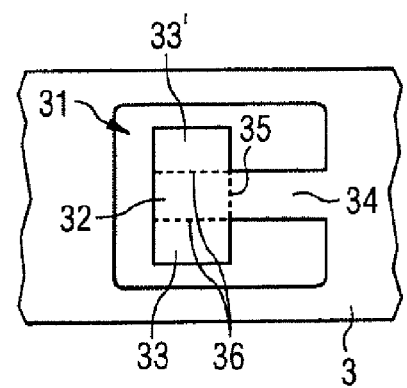
FIG. 5b is a plan view of the tab formed in the lead frame, in an unfolded state.

FIG. 5b is a plan view of the lead frame 3 and the tab 31 according to FIG. 5a in an unshaped and unfolded state. This unfolded state corresponds to an unprocessed state, which exists before the tab 31 is shaped. In order to produce the tab 31, this folded shape is formed during punching of the lead frame 3. In this case, the strut 34, the back 32 and the tab wings 33, 33' are arranged in a plane together with the remainder of the lead frame 3. In order to form the tab 31, initially the back 32 is then bent perpendicularly relative to the strut 34 along a first bending line 35, such that the back 32 extends perpendicularly from the plane of the lead frame 3. Subsequently, the tab wings 33, 33' are angled perpendicularly relative to the back 32 along second bending lines 36, both tab wings 33, 33' being angled away from the strut 34 in the same direction. A U-shape of the tab 31 is thus produced, which tab is oriented perpendicularly to the plane of the lead frame 3. In order to connect the contact 2 to the lead frame 3, the contact 2 is introduced into the tab 31 between the tab wings 33, 33', perpendicularly to the lead frame 3. Subsequently, said contact is fastened to the tab 31 as described with reference to FIG. 5a.

Although the present invention has been fully described above on the basis of preferred embodiments, it is not restricted thereto but rather can be modified in a wide variety of ways.

The invention claimed is:

1. An electrical contact arrangement for an electric motor, comprising:
   an elongate contact which extends perpendicularly to a planar base conductor;
   wherein:
   the planar base conductor is formed as a lead frame and wherein at least one of a conductive integral and a positive connection is provided between the lead frame and the contact, wherein the conductive connection has a contact foot which is angled perpendicularly away from the contact and which extends in parallel with the lead frame, and
   wherein the contact is guided through the lead frame and the contact foot makes contact with the lead frame at the side of said foot which is oriented towards the contact and is welded on the surface of the lead frame.

2. An electrical contact arrangement for an electric motor, comprising an elongate contact which extends perpendicularly to a planar base conductor, wherein:
   the base conductor is formed as a lead frame;
   at least one of a conductive integral and a non-positive connection is provided between the lead frame and the elongate contact; and
   the conductive integral and non-positive connection comprises a tab formed in the lead frame, the tab including a back which is positioned perpendicularly to the lead frame and two tab wings which are angled perpendicularly to the back, the contact being introduced into the tab between the tab wings and fastened therein.

3. The arrangement of claim 2, wherein the tab is formed in one piece with the lead frame and comprises a strut which is connected to the back and by means of which said tab is connected to the lead frame.

4. A method for producing an electrical contact arrangement, comprising steps of:
   providing a flat lead frame and an elongate contact;
   arranging the elongate contact perpendicularly to the flat lead frame; and producing a conductive integral and/or positive and/or non-positive connection between the elongate contact and the flat lead frame;

wherein the connection is produced using a contact foot, which is formed on the elongate contact and is perpendicularly angled thereto and extends in parallel with the flat lead frame, comprising the following steps:

guiding the contact foot through an opening in the lead frame and placing a surface of the contact foot oriented towards the elongate contact on the lead frame, or positioning a surface of the contact foot oriented away from the contact on the lead frame; and welding the contact foot onto the lead frame.

5. A method for producing an electrical contact arrangement, comprising steps of:

providing a flat lead frame and an elongate contact;

arranging the elongate contact perpendicularly to the flat lead frame;

producing and/or positive and/or non-positive connection between the elongate contact and the flat lead frame, wherein the connection is produced using a tab, which is formed in one piece in the flat lead frame and comprises a back, a strut connected to the back and to the flat lead frame, and two tab wings which are angled perpendicularly to the back, comprising the following steps:

positioning the back perpendicularly relative to the flat lead frame;

angling the tab wings perpendicularly relative to the back;

introducing the elongate contact into the tab between the tab wings; and staking the tab and the elongate contact.

6. The arrangement of claim 1, which is configured to be used for an EC drive of a motor vehicle fan.

7. The arrangement of claim 2, wherein the contact is staked into the tab.

8. The method of claim 4, wherein the method is used to produce an electrical contact arrangement for an electric motor.

9. The arrangement of claim 2, which is configured to be used for an EC drive of a motor vehicle fan.

10. The method of claim 5, wherein the method is used to produce an electrical contact arrangement for an electric motor.

* * * * *